United States Patent [19]

Hallford

[11] 4,245,356
[45] Jan. 13, 1981

[54] FREQUENCY TRANSLATOR
[75] Inventor: Ben R. Hallford, Wylie, Tex.
[73] Assignee: Rockwell International Corporation, El Segundo, Calif.
[21] Appl. No.: 34,045
[22] Filed: Apr. 27, 1979
[51] Int. Cl.³ .............................................. H04B 1/26
[52] U.S. Cl. ..................................... 455/327; 333/26
[58] Field of Search .......................... 333/4, 5, 25, 26; 363/157–159; 455/326, 327, 328; 325/442, 445, 446, 449

[56] References Cited

U.S. PATENT DOCUMENTS

| | | | |
|---|---|---|---|
| 3,818,385 | 6/1974 | Mouw | 325/446 X |
| 4,063,176 | 12/1977 | Milligan et al. | 325/446 |
| 4,125,810 | 11/1978 | Pavio | 325/446 |

Primary Examiner—Jin F. Ng
Attorney, Agent, or Firm—Bruce C. Lutz; Howard R. Greenberg; H. Fredrick Hamann

[57] ABSTRACT

A planar balun coupled frequency translator (upconverter or downconverter, is illustrated in various configurations for providing both full-wave and half-wave signal frequency conversion. As illustrated, each of the circuits uses microstrip and strip transmission line construction techniques for cost effective construction. As designed, the carrier and signal frequency baluns are separately interfaced in sets rather than all being connected in series as in the prior art.

4 Claims, 15 Drawing Figures

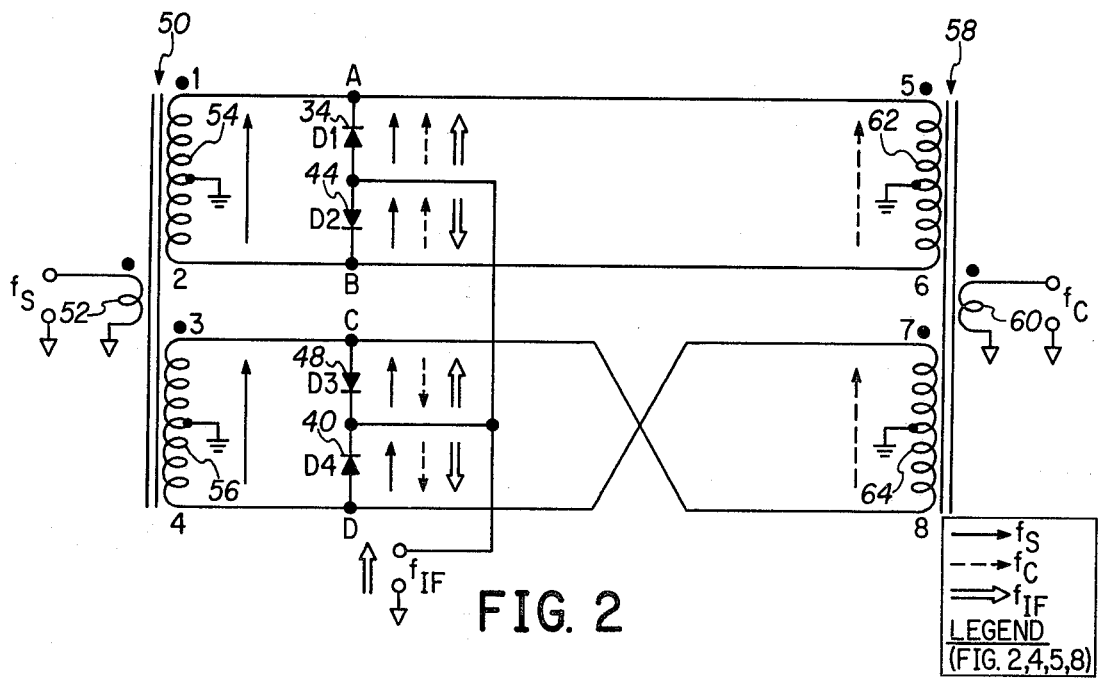
FIG. 2
RELATIVE VOLTAGE PHASE TABLE
|  | D1 | D2 | D3 | D4 |
|---|---|---|---|---|
| $\theta_C$ | 0° | 180° | 180° | 0° |
| $\theta_S$ | 0° | 180° | 0° | 180° |
| $\theta_I$ | 0° | 180° | 0° | 180° |
| $\Delta_{IF}$ | 0° | 0° | 180° | 180° |
| $(\theta_{IF}+\Delta_{IF})$ | 0° | 0° | 0° | 0° |
FIG. 3
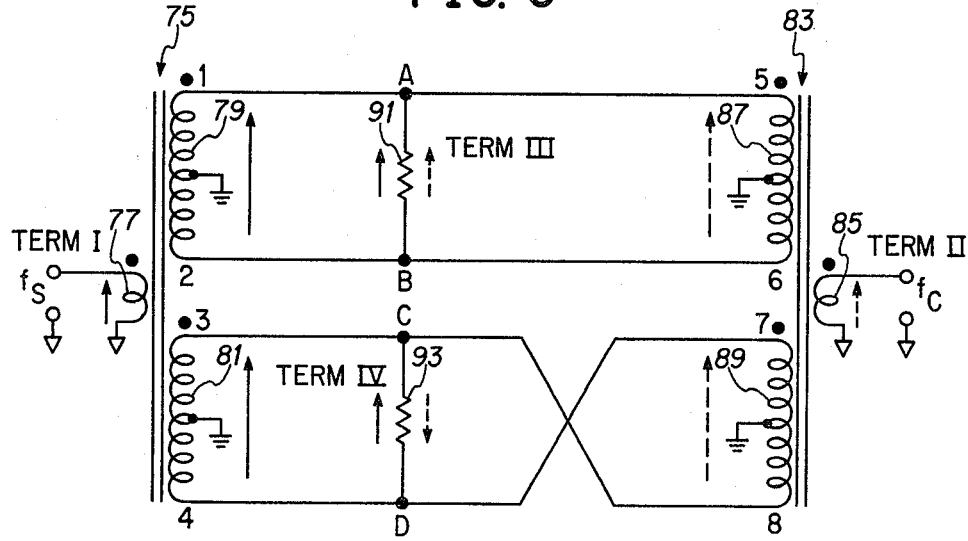
FIG. 4

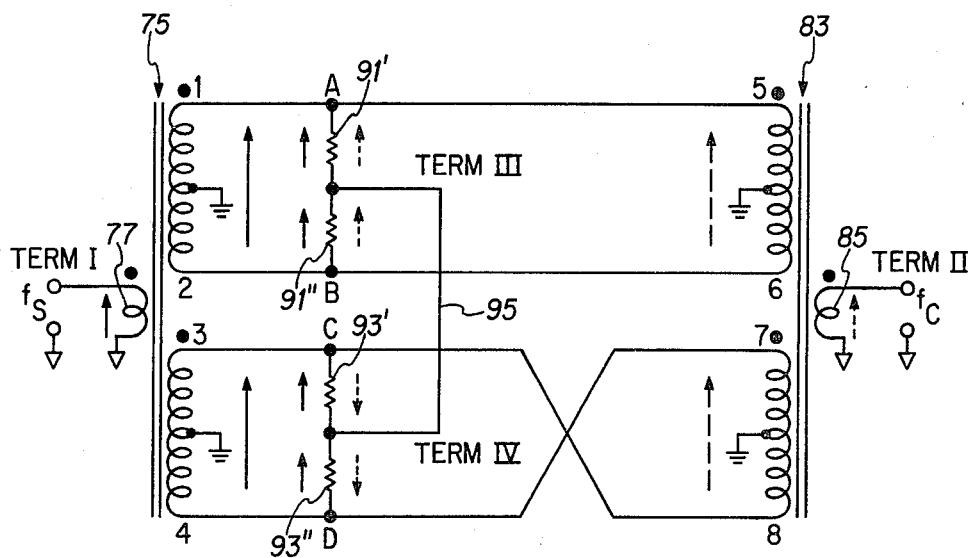
FIG. 5
| INPUT | COUPLED TO | COUPLED PHASE DIFFERENCE $\theta$ | ISOLATION FROM |
|---|---|---|---|
| I | III, IV | 0° | II |
| II | III, IV | 180° | I |
| III | I, II | 0° | IV |
| IV | I, II | 180° | III |
FIG. 6
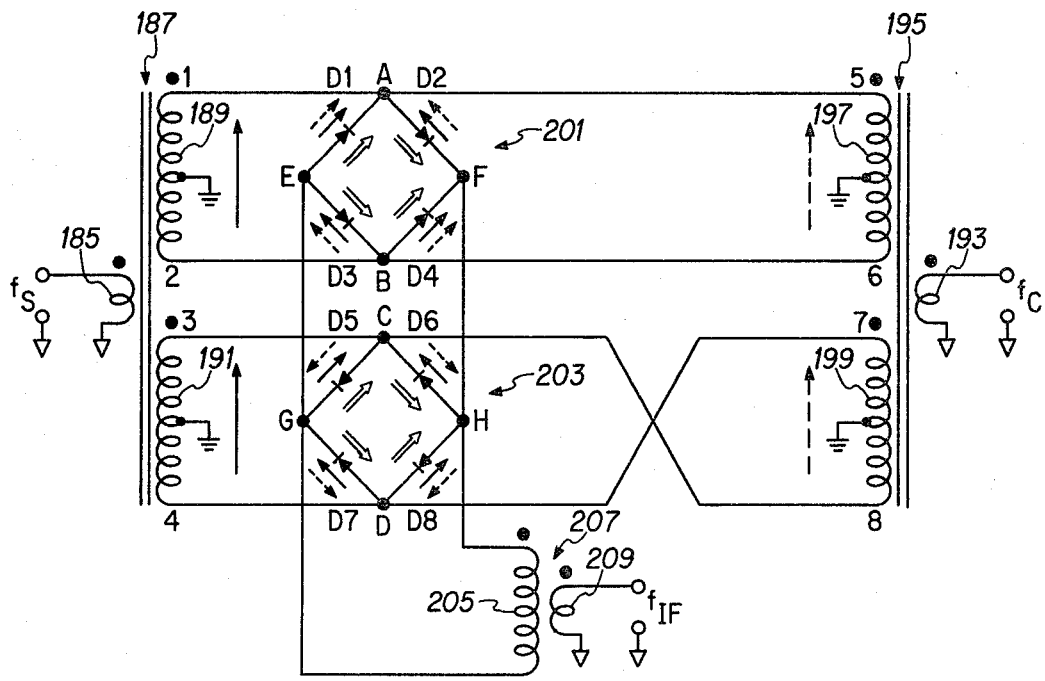
FIG. 8

RELATIVE VOLTAGE PHASE TABLE

|  | D1 | D2 | D3 | D4 | D5 | D6 | D7 | D8 |
|---|---|---|---|---|---|---|---|---|
| $\theta_C$ | 0° | 180° | 180° | 0° | 0° | 180° | 180° | 0° |
| $\theta_S$ | 0° | 180° | 0° | 180° | 0° | 180° | 0° | 180° |
| $\theta_I$ | 0° | 180° | 0° | 180° | 0° | 180° | 0° | 180° |
| $\theta_{IF}$ | 0° | 0° | 180° | 180° | 180° | 180° | 0° | 0° |
| $(\theta_{IF}+\Delta_{IF})$ | 0° | 0° | 0° | 0° | 180° | 180° | 180° | 180° |

FREQUENCY TRANSLATOR

THE INVENTION

The present invention is generally concerned with electronics and more specifically concerned with frequency converters. Even more specifically, the present invention deals with microstrip frequency converters using cost effective design construction techniques.

Prior art approaches to frequency translators have used a series connection of the secondary windings of the baluns involved therewith. Such an example is found in a Mouw U.S. Pat. No. 3,818,385 which issued June 18, 1974 to Aertech of Sunnyvale, Calif. The equivalent circuit in this patent showing such a connection is as an example FIG. 5. Another example of such a type of connection is shown in my copending patent application Serial No. 889,171 filed Mar. 23, 1978, now U.S. Pat. No. 4,186,352, issued Jan. 29, 1980, and assigned to the same assignee as the present invention. This invention used similar planar balun microstrip and stripline transmission line construction techniques as the present invention but did not have the same approach to isolation and did not achieve mutual isolation in the same manner as the present invention between balun secondaries for the signal and carrier frequency portions of the converter.

While my other invention referenced above has performed to expectations, there have been instances where it would be desirable to have more versatility over a broad frequency range in the placement of the input-output ports. In other words, it is sometimes desirable to have all of the ports on one side of a board and it is also desirable at times to change these around. The present invention offers a great deal of flexibility in this respect while still using similar design criteria in designing the structural characteristics of the baluns involved.

It is therefore, an object of the present invention to provide an improved frequency translator.

Other objects and advantages of the present invention will be apparent from a reading of the specification and appended claims in conjunction with the drawings wherein:

FIG. 2 is a low frequency lumped element equivalent circuit representation of the microstrip circuit of FIG. 1;

FIG. 3 is a table illustrating the relative voltage phases in the equivalent circuit of FIG. 2;

FIG. 4 is a low frequency lumped element equivalent circuit of a hybrid formed by the two baluns of FIG. 1 showing a single load;

FIG. 5 is a further low frequency lumped element equivalent circuit of the hybrid formed by two baluns with a split load;

FIG. 6 is a further table illustrating the vector relations in the hybrids of FIGS. 4 and 5;

FIG. 8 is a low frequency lumped element equivalent circuit of the embodiment illustrated in FIG. 7;

DETAILED DESCRIPTION

Figure 1:
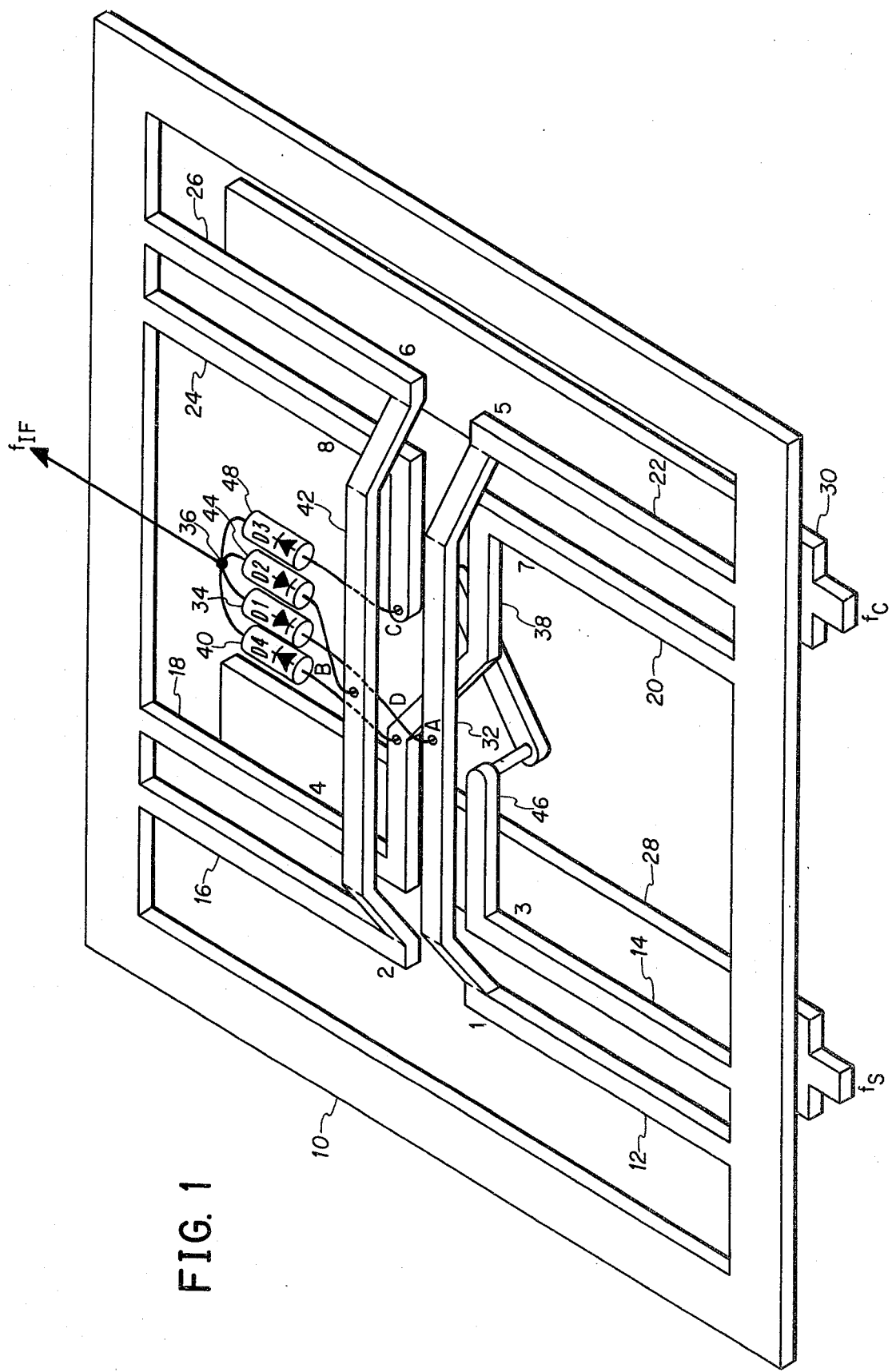
FIG. 1 is a representation of a first embodiment of the invention which is a half-wave double balanced frequency translator.

In FIG. 1, a ground plane 10 completely encloses on all four sides a plurality of conductors, balun secondary circuit paths or signal coupling means 12, 14, 16, 18, 20, 22, 24 and 26, each extending from the ground plane 10, connected thereto and in the same planar surface as the ground plane. Signal coupling means 12 is coupled to a transmission line signal conductor means or balun primary circuit path 28 as are the circuit paths 14, 16 and 18. Transmission line conductive means 28 receives the signal frequencies ($f_s$) which are supplied to the translator of FIG. 1. Coupling means 20 is coupled to a carrier frequency ($f_c$) transmission line conductive means or balun primary circuit path 30 as are circuit paths 22, 24 and 26. The end or terminal of each of the circuit paths 12 through 26 which is furthest from the ground plane connection is additionally labeled with numbers 1 through 8 as illustrated. As shown, a conductive path 32 connects terminals 1 and 5 of circuit paths 12 and 22 respectively. At the approximate center of this path is a terminal labeled A to which is connected a D1 diode 34. The other end of diode 34 is connected to a junction point 36 which receives IF or intermediate frequency signals. End 4 of circuit path 18 is connected to end 7 of circuit path 20 by a lead or conductive path 38 which has an intermediate terminal labeled D to which a D4 diode 40 is connected whose other lead is connected to junction point 36. End 2 of circuit path 16 is connected to end 6 of circuit path 26 via a signal conductor 42 which has an intermediate terminal B to which a D2 diode 44 is connected which has its other lead connected to junction point 36. Finally, a conductive path 46 is used to connect end 3 of circuit path 14 to end 8 of circuit path 24. An intermediate point C is connected to one end of a diode D3 also designated as 48 which has its other lead connected to junction point 36.

In actual fabrication of the device of FIG. 1, the ground plane 10 along with the signal coupling means would be applied to one side of a substrate or printed circuit board while the transmission line conductive means 28 and 30 would be attached to the opposite side of the substrate. The substrate in most illustration herein has been eliminated for purposes of clarity. The odd looking arrangement for conductive path 46 is the result of trying to connect the terminals 3 and 8 where these paths must cross the other paths and thus plated through holes on the board are used to provide part of the connection on the opposite side of the board. The connections 42 and 32 also must bridge the conductive path 38. This can be accomplished by a variety of means including simple small bridges at each of the cross-overs or additional substrate material can be used to cover underlying paths.

Regardless of the method used, it is desirable for most effective operation of the device that the connection points A, B, C and D of the diodes to the respective conductive paths be at appropriate points from the secondary circuit path pairs so that the relative phases of the signals at the diodes either be substantially in phase or substantially exactly out of phase. As illustrated for convenience, they are connected at approximate midpoints.

As previously indicated, FIG. 2 is an equivalent circuit of the apparatus of FIG. 1. As illustrated, a signal frequency $f_s$ is applied to a coupling means illustrated as a transformer 50 having a primary winding 52 and a pair of center tapped secondary windings 54 and 56. Additionally, a second coupling device represented as a transformer 58 has a primary winding 60 connected to a carrier signal $f_c$ and also has two center tapped secondary windings 62 and 64. The center tapped secondary windings have terminals labeled 1 through 8 which correspond with similar designations in FIG. 1. Additionally, diodes are shown in FIG. 2 having the same designations as used in FIG. 1. As will be obvious to anyone skilled in the art, the primary windings 52 and 60 represent the primary circuit or transmission line conductive means 28 and 30 while the secondary windings represent the secondary circuit or signal coupling means which are coupled to these transmission line conductor means. In other words, secondary winding 54 represents the coupling obtained by circuit paths 12 and 16 each of which has greater RF voltages as they extend away from the ground plane 10. The ground plane 10 is effectively a center tapped ground point of the same potential at the point of connection and thus is shown in FIG. 2 as a common connection to ground. The same comments apply to the remaining secondary windings. Finally, there are arrows used to explain relative voltage signal phases as further defined infra and in Table 3. A solid arrow is used to represent the signal frequency phases, a dash line arrow is used to represent the relative carrier frequency signals and the double line arrow is used to represent the phases of the intermediate or IF frequency signals.

FIG. 4 is used to illustrate the low frequency lumped element equivalent circuit of a hybrid formed by the two baluns of the microstrip circuit of FIG. 1. In other words, the common diode load is not shown. As illustrated, a first balun 75 has a primary winding 77 and two secondary windings 79 and 81. A second balun represented by 83 has a primary winding 85 and two secondary windings 87 and 89. The primary winding 77 receives a signal frequency signal and is alternatively labeled terminal I. The primary winding 85 is labeled terminal II and receives a carrier frequency signal. Each of the secondary windings is centertapped and connected to ground. As illustrated, the windings are connected in the same manner as shown in FIG. 2. In other words, winding 79 is connected in parallel with 87 with effective dot connections together and has a load 91 connected between terminals A and B. Winding 81 is connected in parallel with 89 but connected (cross dot connections) in such a way as to cancel any signal frequency signals in core 83 and cancel carrier frequency signals in core 75. Between junction points C and D a load 93 is connected in parallel with the two secondary windings. As will be observed, the carrier and signal frequency signals have the same polarity orientation in the load 91 which is connected across terminal III while the carrier and signal frequency signals have opposing polarity orientations in load 93 connected across terminal IV.

FIG. 5 illustrates substantially the same hybrid as illustrated in FIG. 4 except that the two loads 91 and 93 have been split such that there are loads 91', 91'', 93' and 93''. Additionally, a common connection between equipotential points at the center of A-B and C-D load composite resistors 91 and 93 are connected by a connection 95. Again, arrows are used to illustrate the relative phases at various points throughout the circuit. An observation of these arrows will illustrate that they are identical with that illustrated in FIG. 4.

Figure 7:
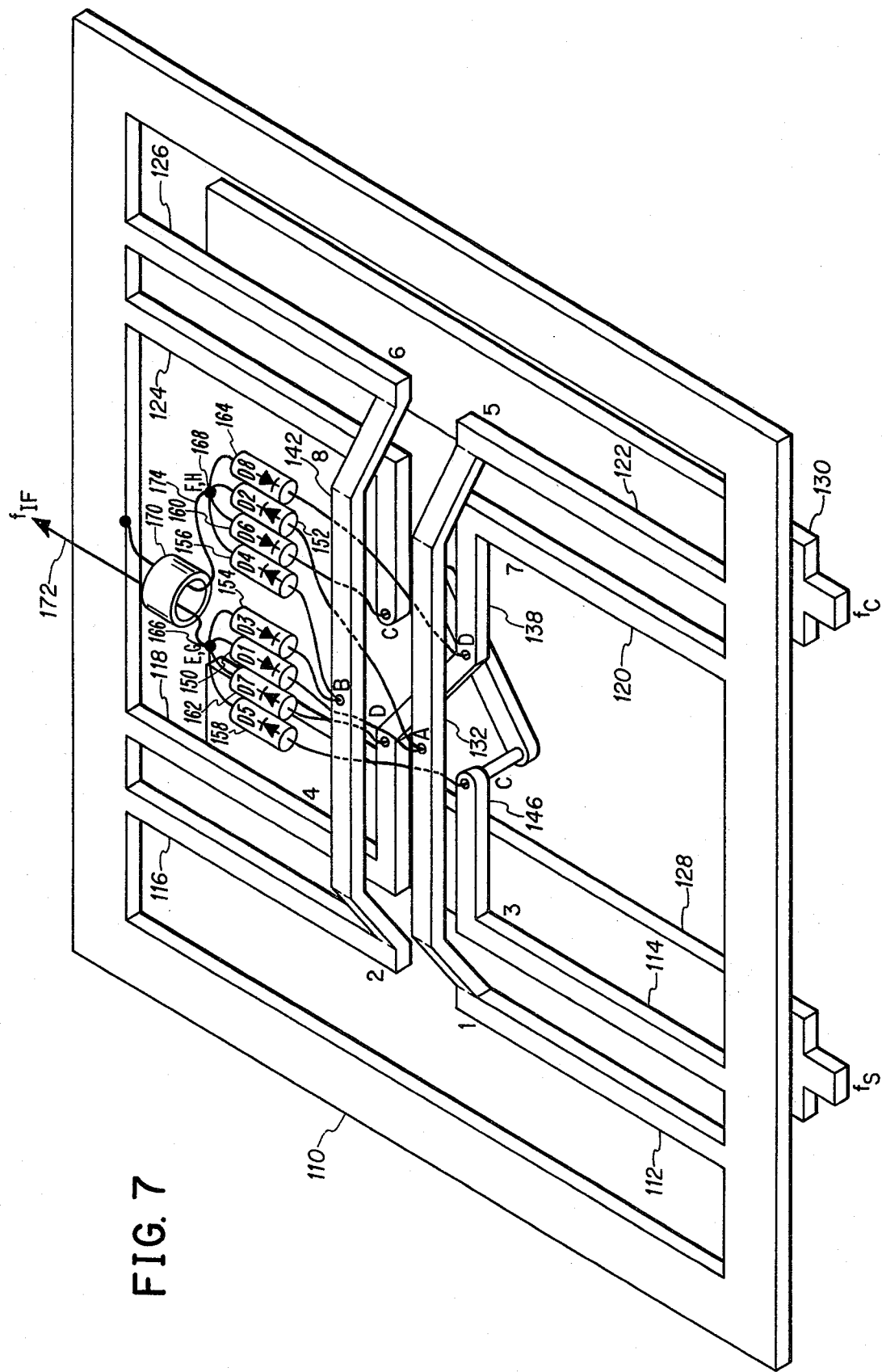
FIG. 7 is an illustration of a double balanced full-wave frequency translator incorporating the concepts of the present invention.

The double balanced frequency translator of FIG. 7 is similar in construction to that of FIG. 1. The only difference comprises four more diodes and a ferrite core used as an IF balun to alter the balanced output to an unbalanced output for interfacing with normally unbalanced IF signal sources or loads. Since the parts are for the most part identical, the same designation is used as used in FIG. 1 except that the designator is 100 values higher. However, the diodes are newly numbered with diodes D1 through D8 having the designations 150, 152, 154, 156, 158, 160, 162, and 164. As illustrated, diodes D1, D3, D5 and D7 all have one end connected to a common junction 166 and the other ends connected respectively to A, B, C and D terminals. Likewise, diodes D2, D4, D6 and D8 are connected to a common junction 168 and at the other end connected respectively to terminals A, B, C and D. A ferrite core used as an IF balun 170 has a lead 172 passing therethrough from junction 166 to the IF output while a further lead 174 passes therethrough from junction 168 to ground 110.

The low frequency lumped element equivalent circuit of FIG. 8 illustrates the relative phase components of signals interacting in the frequency translator. As illustrated, a signal frequency is applied to a primary winding 185 of a balun generally designated as 187 having secondary windings 189 and 191. Carrier frequency signals are applied to a primary winding 193 of a balun generally designated as 195 having centertapped secondary windings 197 and 199. A first diode bridge 201 containing diodes D1 through D4 is connected as shown between termination points A and B while a second diode bridge 203 containing D5 through D8 are connected as shown between terminals C and D. As further illustrated, junctions F and H are tied together on bridges 201 and 203 to a dot side of winding 205 of a balun generally designated as 207 and having the other end of winding 205 connected to junctions E and G on bridges 201 and 203. A secondary winding 209 provides a connection to IF signal sources or loads depending upon whether the translator is used as an upconverter or a downconverter.

Figures 9, 11:
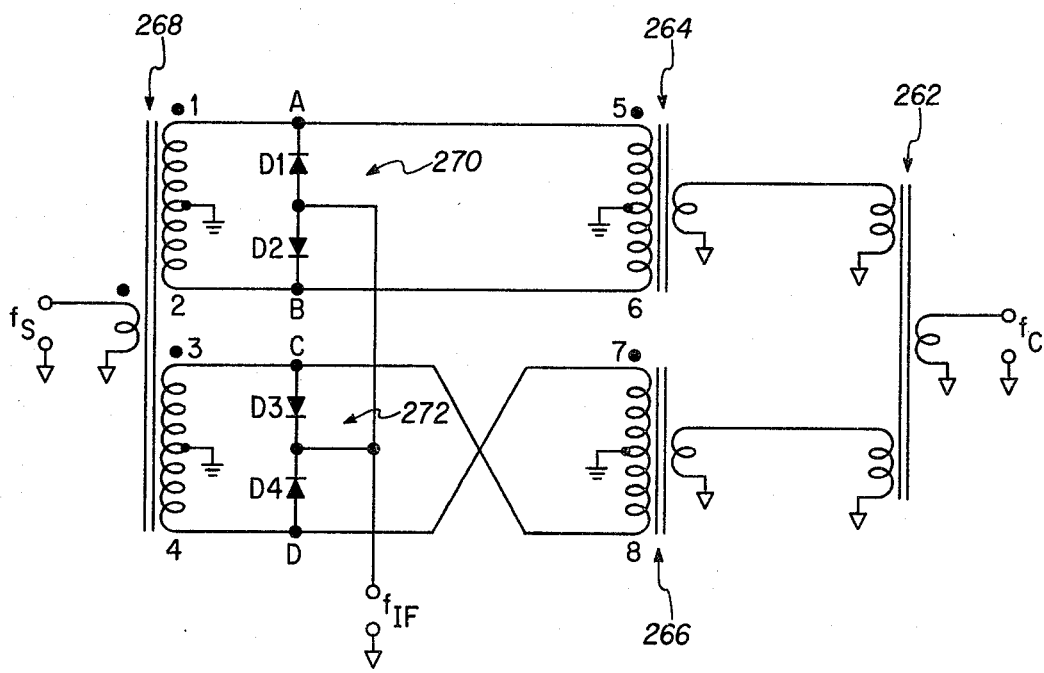
FIG. 9 is a table providing relative voltage phase values of signals in FIG. 8.
FIG. 11 is a low frequency lumped element equivalent circuit of the apparatus illustrated in FIG. 10.

FIG. 9 illustrates the relative phases of the various signals within the equivalent circuit in the same manner as illustrated previously in FIG. 3.

FIG. 6 illustrates the relative phases of the signals within the hybrids of FIG. 4 and FIG. 5. Since this is substantially self-explanatory, no further mention will be made of this figure at this time.

Figure 10:
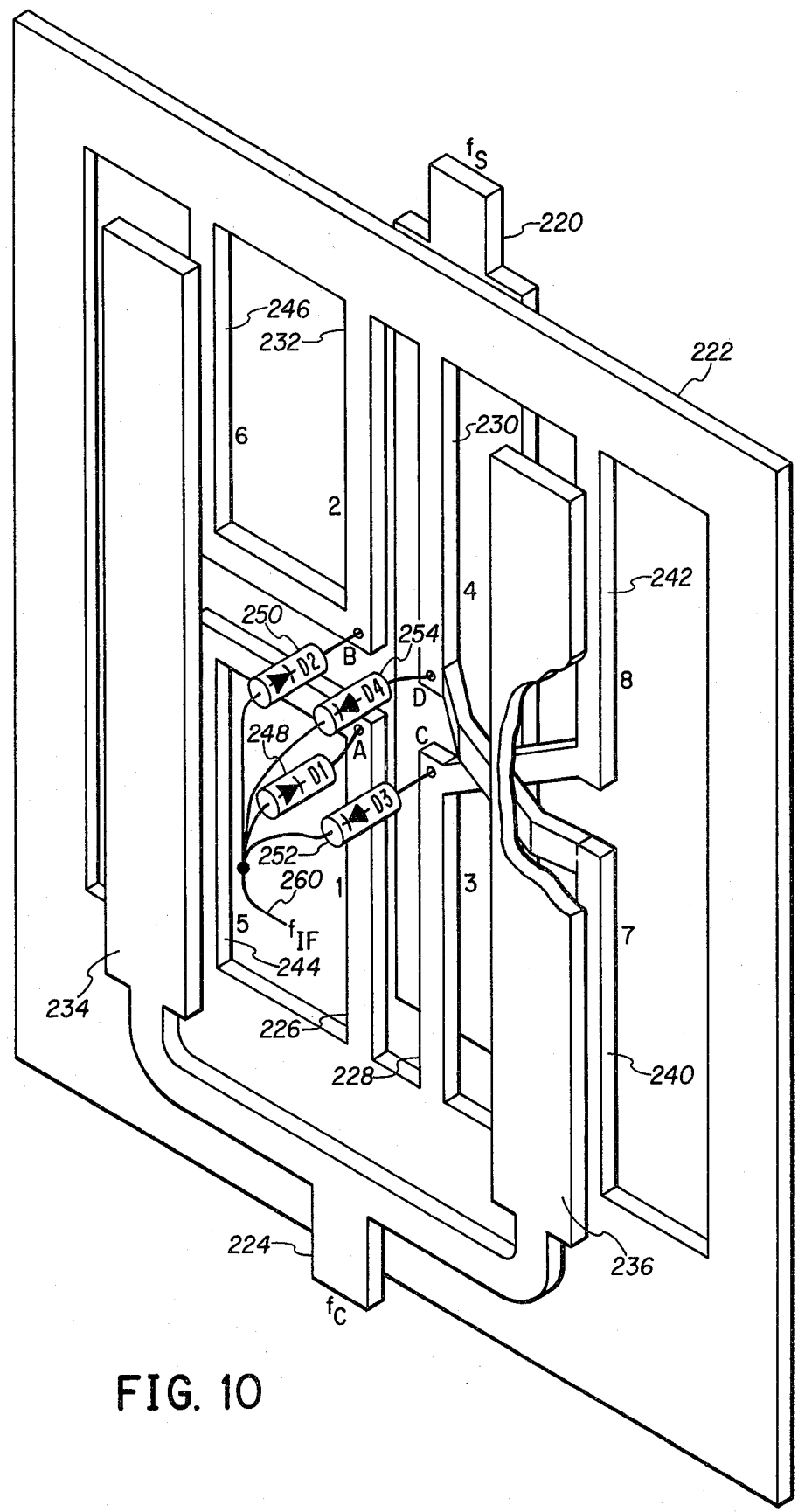
FIG. 10 is an illustration of a third embodiment of the inventive concept wherein the signal and carrier frequency ports are on opposite sides of the substrate material.

FIG. 10 illustrates another embodiment of the inventive concept where the signal frequency signals are input to a microstrip signal conductor 220 on one side of a ground plane structure 222 while carrier frequency signals are input to a bifurcated or forked transmission signal conductor 224 on the other side of ground plane 222. While normal practice would be to use separate substrates between each of the transmission signal conductors 220 and 224 and ground plane 222, they can be merely suspended or spaced with any suitable dielectric. As shown, the transmission signal conductor 220 interacts with signal coupling means 226, 228, 230 and 232 which are respectively connected at one end to ground plane 222 and at the other end are labeled respectively terminals 1, 3, 4 and 2 with alternate labels A, C, D and B. The forked transmission signal conductor 224 is split into two separate bifurcations, arms, tines legs 234 and 236 which as illustrated widen immediately prior to interacting with the secondary signal coupling means for the purpose of providing the proper impedance matching to signal sources or loads attached to conductor 224. As illustrated, the leg 236 coacts with conductors 240 and 242 which are each connected at one end to ground plane 222 and at the other end are labeled terminals 7 and 8 respectively and which as further illustrated are connected to junctions D and C respectively. Likewise, conductor 234 coacts with signal conductors 244 and 246 which are each connected at one end to ground plane 222 and at the other end are labeled terminals 5 and 6 respectively and connected to terminals A and B. On the left side of FIG. 10 are shown diodes D1 through D4 or alternatively diodes 248, 250, 252 and 254 which are connected to the terminals A through D as shown. The other end of each of these diodes is connected to a common junction and to IF signal frequency terminal 260.

The low frequency lumped element equivalent circuit of FIG. 11 which illustrates the equivalent circuit of FIG. 10 is very similar to previous equivalent circuits except that as shown the forked device with input lead 224 acts as a power splitter 262 which supplies signals to separate primaries of a set of two single transformers 264 and 266. Thus, the canceling effect occurs back in the power splitter 262 rather than in the cores of the single baluns as previously occurred. Otherwise, the circuit is substantially identical with a dual balun 268 and half-wave diode pairs 270 and 272.

Figure 12:
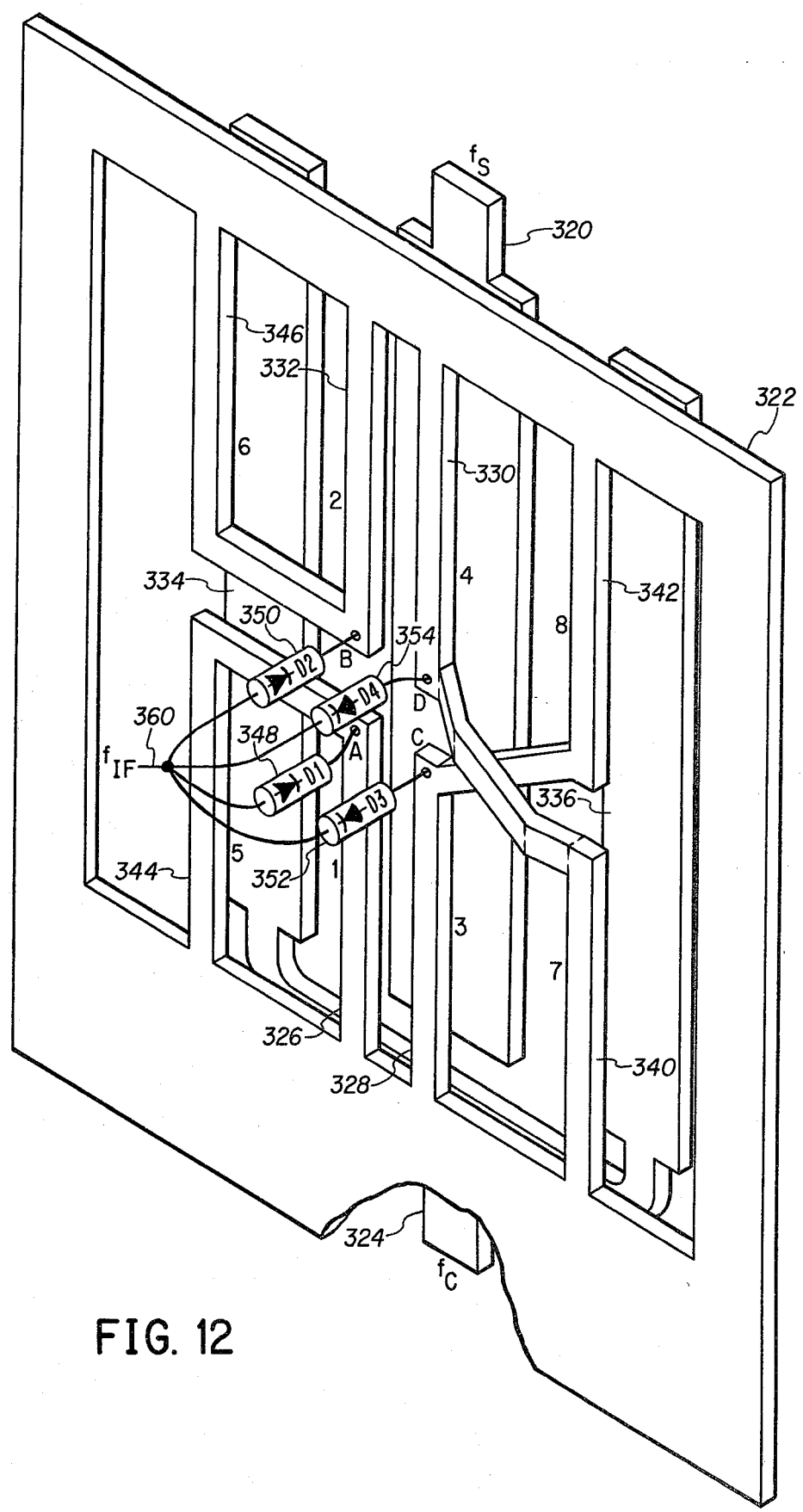
FIG. 12 is a further modification of the balun coupled frequency converter of FIG. 10.

FIG. 12 illustrates a modification of FIG. 10 wherein the signal frequency and carrier frequency transmission signal conductors are both mounted on the same side of the board. Since these are so similar, each of the designators are the same as in FIG. 10 except that the designators are 100 values higher.

Figure 13:
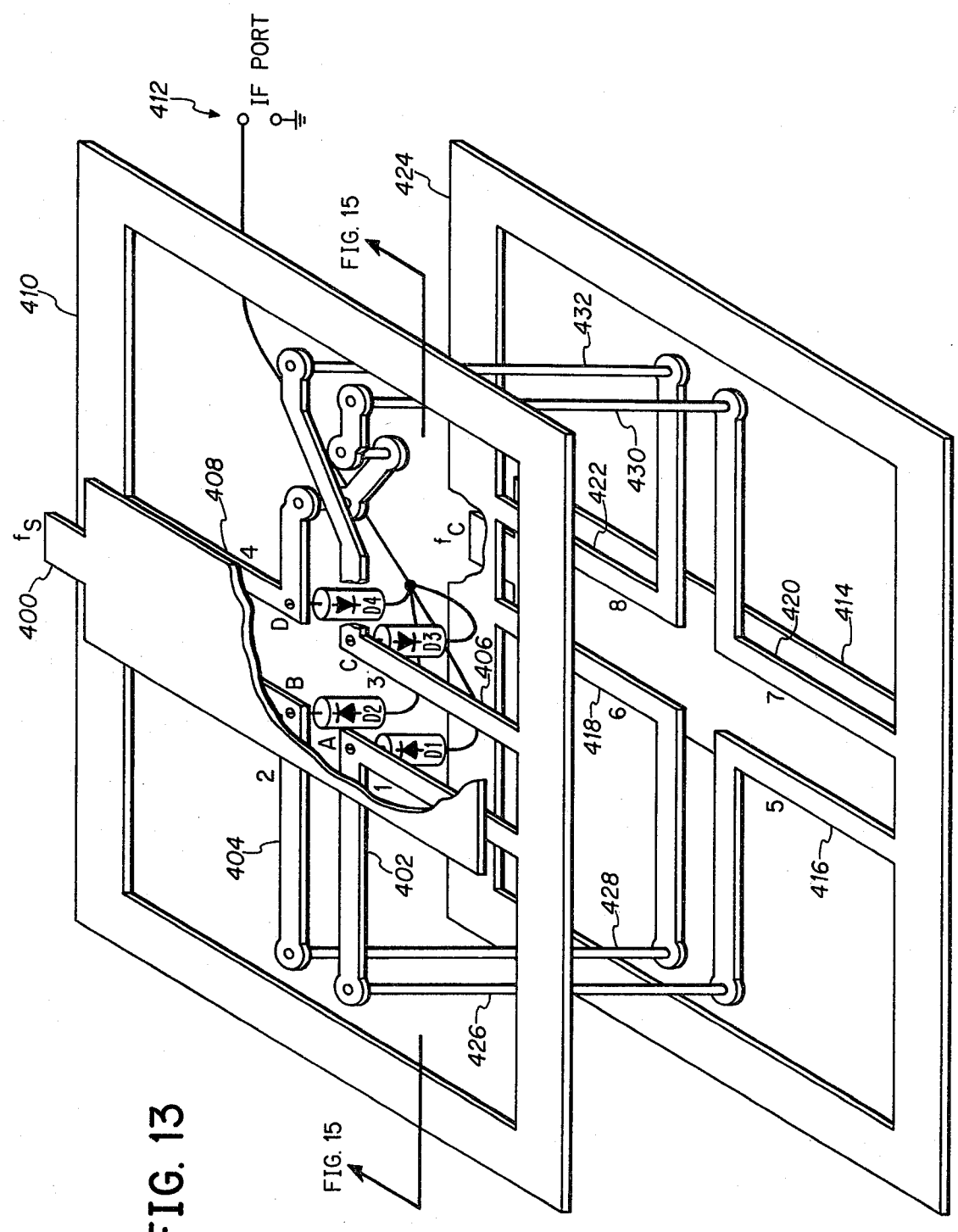
FIG. 13 is a further modification of the embodiment illustrated in FIG. 1.

In FIG. 13, a signal frequency transmission signal primary conductor 400 is coupled to a plurality of signal coupling secondary means 402, 404, 406 and 408 which are each connected at one end to a ground plane 410. At the other end of each of these signal coupling means 402 through 408, they are labeled respectively 1, 2, 3 and 4 and likewise A, B, C and D. A set of diodes, D1 through D4 are used to connect the points or terminals A through D to a common junction which is used as an IF output port generally designated as 412. A carrier frequency transmission signal conductor means 414 is coupled to a plurality of signal coupling means 416, 418, 420 and 422. One end of each of these signal coupling means 416 through 422 is connected to a ground plane 424 while the other end is labeled 5 through 8 as illustrated. The terminals 5 through 8 are connected to terminals 1 through 4 by electrical conductive means or wires 426, 428, 430 and 432.

Figure 14:
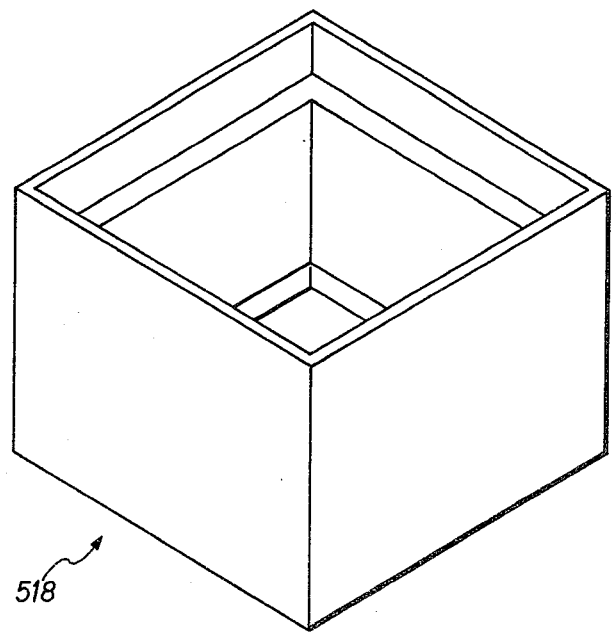
FIGS. 14 and 15 illustrate the mechanics of construction for the embodiment of FIG. 13.

FIG. 14 illustrates a container into which the frequency translator illustrated by FIG. 13 can be constructed.

Figure 15:
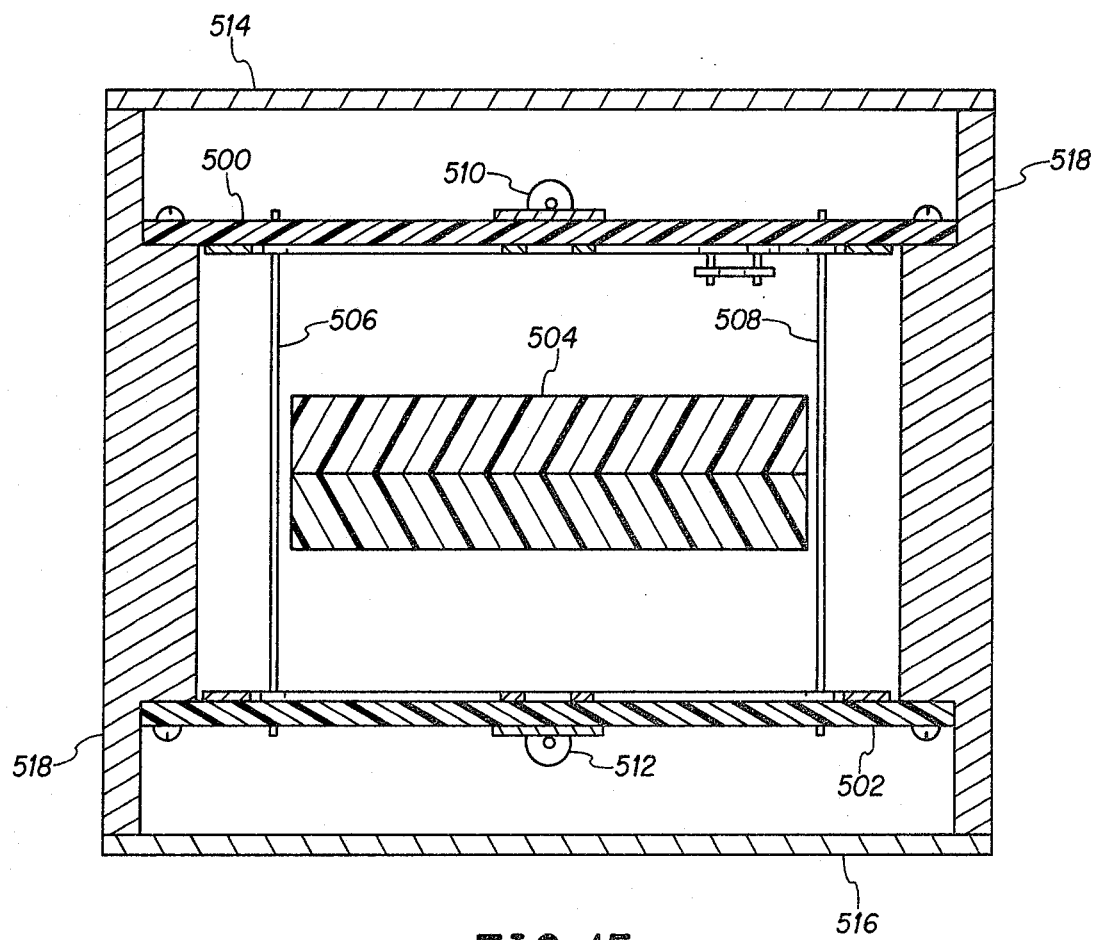

FIG. 15 shows a cross sectional view of FIG. 14 with the circuitry of FIG. 13 inserted. In FIG. 15, in addition to an upper board 500 and a lower board 502, there is inserted some RF absorbing material 504. As illustrated, the connecting wires 506 and 508 (equivalent to wires 426 through 432 of FIG. 13) hold the two boards 500 and 502 in place. The RF absorbing material can either be free floating, packed in between the boards 500 and 502 or supported by other means on the ends of the box in a manner not shown. As illustrated, the portions 510 and 512 are connectors for the carrier and signal frequency signals and there would, of course, be a connector for the IF frequency signals. To finalize the construction of this translator, there is also illustrated a cover 514 and a bottom 516 which coact with the sides 518 to completely enclose the translator and shield it from extraneous interfering signals.

Operation

From reading my previously referenced copending application and from observing FIG. 1, it will be noted that a potential applied to a primary conductor, such as 28, is equally divided between the two secondary conductor pairs. The relative polarity is such that terminal 1 is negative with respect to terminal 2 and terminal 3 is negative with respect to terminal 4. Likewise, terminals 1 and 3 have no potential difference, one relative the other, and the same applies to terminals 2 and 4. Thus, if the primary conductor 28 and the secondary conductor pairs or coupling means are used alone as a microstrip dual balun (see FIG. 4) rather than as part of a frequency translator, a load may be connected between terminals 3 and 4 or between 1 and 2 in a conventional manner. A load also may be connected between terminals 2 and 3 and between 1 and 4 since these terminal pairs have the same potential difference as terminals 1–2 and 3–4. This feature lends a degree of freedom in joining loads to the balun output, such that mutual isolation is maintained between the three principal signals when the baluns are arranged as shown in FIG. 1 for a frequency translator. The three principal signals would be (1) $f_s$ the input or output RF signal, (2) $f_c$ the local oscillator or pump carrier and (3) $f_{IF}$ the intermediate frequency carrier.

As will be noted, the ends of the secondary windings in FIG. 2 are labeled with the same terminal numbers as found in FIG. 1 at the end of the secondary circuit paths furthest from ground plane 10. These numbers designate identical points in the two respresentations of the invention. The conduction path for the signal $f_s$ in the balun pairs 1–2 and 3–4 is such that conduction occurs between points B–C and A–D. The signal $f_s$ flows from point C through diode D3, to diode D2 and finally to point B. The signals from terminal D flow through diode D4, D1 to terminal A.

The local oscillator $f_c$ follows similar conduction paths. From point D to point B, it flows through diode D4 and D2.

The relative phase relationship of the signal $f_s$, the local oscillator $f_c$, the image frequency $f_i$, and the IF signal $f_{IF}$ is shown in the table of FIG. 3. The relative phases of $f_s$ and $f_c$ are obtained from the arrows shown in the equivalent circuit of FIG. 2. The arrows are drawn according to the winding orientation of the baluns indicated by the voltage polarity dots. The signal $f_s$ is illustrated as a solid arrow with the head pointing to the dot ends of the balun windings. The local oscillator signal $f_c$ uses a dash line arrow with the same orientation. Solid and dash line arrows are then drawn to the side of each diode in the same direction as the main arrows in the conduction path sequence previously described. To convert these arrows to a relative phase angle, the ground point at 70 MHz is defined as the terminals A, B, C and D. (These points are also ground at DC but are not ground at RF frequencies.) Since angles in this diagram will be either 0° or 180°, it has been assumed that if an arrow points to these IF ground points, the relative phase angles will be 0°. If pointing away from these ground points, the phase angle will be 180°. As is known to those skilled in the art, the polarity connection of the diodes will affect the IF phase only, so it is assumed that a diode that points to the IF ground points A, B, C, or D will give a 0° $f_{IF}$ phase angle. However, the diodes pointing away from these points will add 180° to the $f_{IF}$ phase. These phase corrections are shown as $\Delta_{IF}$ in FIG. 3. The image frequency phase angle $\theta_I$ and the IF phase angle $\theta_{IFS}$ are calculated by the following formulas:

| | Equation | | Condition | |
|---|---|---|---|---|
| (1) | $\theta_I = \theta_S - 2\theta$ | $f_s >$ or $< f_c$ | Where | $\theta$ = Phase of signal $f_s$ |
| (2) | $\theta_{IFS} = \theta_S - \theta_C$ | $f_s > f_c$ | | $\theta_C$ = Phase of local oscillator $f_c$ |
| (3) | $\theta_{IFS} = -(\theta_S - \theta_C)$ | $f_s < f_c$ | | $\theta_I$ = Phase of image $f_I$ |
| | | | | $\theta_{IFS}$ = Phase of signal IFS |

The examples in equations 1 through 3 assume the $f_s$ is not equal to $f_c$. After the $\theta_{IFS}$ is calculated, the frequency final IF phase is obtained by adding $\theta_{IF}$ to $\theta_{IFS}$. Note that the net result in phase of IF signals in the diodes is zero. The image frequency phase $\theta_I$ is the same as the $f_s$ phase which means that the image frequency generated by the diodes will be fed from the diodes out into the $f_s$ line. As will be realized, the image frequency is applicable only where the frequency translator is used as a downconverter.

A very important part of a frequency translator is isolation. Isolation is obtained between $f_s$ and $f_c$ by reversing the dot connection of the balun line pair 7 and 8 when connected in parallel to pair 3 and 4. This causes the $f_c$ carrier to be 180° out of phase in the $f_s$ line resulting in no $f_c$ voltage in the $f_s$ line. The cancellation of $f_s$ in the $f_c$ line occurs in the same manner. Intermediate frequency $f_{IF}$ isolation is obtained between $f_s$ and $f_c$ by the 180° phase relationship between the $f_s$ and $f_c$ potentials at the IF terminals intermediate the respective diodes. As will be noted, the points A and B are at the same IF potential so this causes the $f_s$ and $f_c$ vectors in diodes D1 and D2 to be in parallel and since they point in opposite directions in these two diodes, there is no net voltage of $f_s$ or $f_c$ at the point intermediate these diodes where the IF signal is removed.

Referring back to FIG. 1, a word of caution must be exercised about the connection of the diodes to the lines between the two baluns. It must be understood that locating the diode lead at different points along these balun lines will cause the relative phase of the signals on that line to change. It is, therefore, necessary that the diodes be connected at points of uniform phase between the four lines. This means that the diodes should be connected at the same vertical position assuming all line lengths are equal. Therefore, it is important not only that the diodes be located on these lines at the proper position, (relative phase locations), but also in the layout itself the line lengths must be made to maintain phase integrity between the two baluns. As an example, the voltage which appears between points 3–4 and 7–8 must be 180° out of phase. Length of these lines should therefore be approximately equal. This 180° phase relationship will provide cancellation therefore in each balun if the voltages of points 1–2 and 3–4 are 180° out of phase with the voltage fed from points 5–6 and 7–8. Cancellation of the $f_s$ signal in the $f_c$ balun and vice versa depends therefore on the two voltages fed from one balun to the other maintaining an exact 180° phase relationship. The diagram drawn in FIG. 1 is for convenience therefore and does not indicate the exact position of the diodes nor the exact length of lines.

The double balanced frequency translator of FIG. 7 shows the same balun connection as FIG. 1 but with a different diode arrangement. This arrangement is full-wave whereas the arrangement of FIG. 1 is half-wave. By definition herein, the term full-wave is applied to translating apparatus wherein the diode paths between opposing terminal pairs allow conduction in both directions in signal translation operation. (Half-wave only allows one polarity of signal conduction.) While the output signals of FIG. 7 require less filtering, this embodiment does not have the simplicity of the fewer diodes of FIG. 1 or the lack of requirement for a balun as must be provided in FIG. 7.

The reason that a balun is required in FIG. 7 is that the IF signal $f_{IF}$ is removed from point E–G and point F–H as a balanced signal is fed to a balun 170 (207) to be converted to an unbalanced output. This diode connection and the balun is shown in both FIGS. 7 and 8. Again, the same arrangement of arrows is utilized to explain the operation of the full-wave translator as used in connection with the half-wave translator.

As will be obvious, a further advantage of the full-wave device of FIG. 7 is that the power handling capability is increased since each individual diode dissipates less power.

It is necessary in constructing the equivalent circuits to maintain the identity of each balun output, that is, terminals 1–2 and 3–4, etc., such that it is not possible to exchange these to obtain a more convenient layout. Thus, when laying out the equivalent circuit of any balun connection, it is necessary to maintain terminals 1 and 2 as a separate balun winding and, similarly, terminals 3 and 4 as another separate winding and so forth. However, great flexibility is obtained using the basic teaching as is illustrated by the alternate implementations of frequency converters shown in FIGS. 10, 12, and 13. Although the last three implementations are all illustrated in a half-wave form for simplicity of drawing, each of these implementations can easily be converted to the full-wave version similar to that shown in FIG. 7.

In view of the equivalent circuits presented, it is believed that only a few comments are required for each of these modifications. As illustrated in FIG. 10, the carrier frequency signal is merely split with a power splitter and applied to the primary conductor of two separate baluns while the signal frequency is provided on a single signal conductor to be coupled to two sets of secondary paths. As shown in FIG. 12, the power splitter can either be on the same side as the unitary signal conductor or on the opposite side and the advantage of this approach is possible ease of implementation of connection of the various secondary paths as opposed to those illustrated in FIGS. 1 and 7. Also, the diodes are much easier to connect in FIG. 10.

The same comments apply to FIG. 13 which uses a set of wires to maintain the appropriate relationship between the two sets of baluns and additionally provide electrical conductivity therebetween. While an RF absorbing material is illustrated between the microstrip circuit boards, this may not be necessary in some situations. The configuration of the enclosure is utilized to even more firmly maintain the structural positioning of the two sets of baluns and their attached diodes as well as the interconnection to the outside world.

The equivalent circuits presented in FIGS. 4 and 5 provide a clearer presentation of the relative phases in hybrids using the present style baluns undisturbed by the presence of diodes. The relative phase of the baluns, as connected in FIGS. 4 and 5, are then presented in FIG. 6. Since the present invention is directed not only to frequency translators but also to hybrids generally, it was believed pertinent to illustrate the relative phases for this part of the inventive concept.

As illustrated in my referenced application, the outside conductors of a coaxial cable can be split and connected to perform the cooperative signal coupling required to practice the present invention if so desired.

In summary, the present invention comprises a hybrid formed by two dual balun pairs wherein the baluns are connected in parallel such that there is isolation between the two inputs.

By adding diodes for the loads, the hybrid can be converted to a frequency translator for use as either an upconverter or downconverter which translator can be configured in any of many physical embodiments.

Although I have illustrated various versions of the invention, I wish to be limited not by those embodiments shown but only by the scope of the appended claims wherein

I claim:

1. Balanced frequency translating apparatus comprising, in combination:
   RF (radio frequency) signal terminal means and IF (intermediate frequency) signal terminal means one of which supplies translating apparatus received signals to the apparatus for frequency translation and the other of which supplies translated output signals;
   planar transmission line means, including first and second balun pairs, for providing signal interfacing between said RF signal terminal means and the translating apparatus;
   carrier signal supplying means, including third and fourth balun pairs, for supplying carrier signals to the translating apparatus;
   first nonlinear circuit means for mixing translating apparatus received signals with the carrier signals;
   means connecting said first and third balun pairs in parallel to said first nonlinear circuit means;
   second nonlinear circuit means for mixing translating apparatus received signals with the carrier signals;
   means connecting said second and fourth balun pairs in parallel and to said second nonlinear circuit means whereby RF and carrier signals are isolated from passing between said RF signal terminal means and said carrier signal supplying means; and
   means connecting said IF signal terminal means to said first and second nonlinear circuit means.

2. The method of frequency translating signals comprising, the steps of:
   separately interfacing a first balun pair of a dual balun RF signal source and a first balun pair of a dual balun carrier signal source in parallel and further interfacing a second balun pair of the dual balun RF signal source with a second balun pair of the dual balun carrier signal source in parallel;
   isolating signal paths between RF and carrier signal sources by connecting said first balun pairs in opposite fashion to the connection of said second balun pairs;
   mixing any signals obtained from a given set of interfaced balun pairs using separate nonlinear circuit means from that used by other signals; and
   nonlinearly interfacing an IF signal means with each set of connected balun pairs.

3. Frequency translator apparatus comprising, in combination:
   signal frequency conductor means for conducting signal frequency type signals;
   carrier frequency conductor means for supplying carrier frequency type signals;
   first balun pair means and second balun pair means each coupled to said signal frequency conductor means;
   third balun pair means and fourth balun pair means each coupled to said carrier frequency conductor means;
   first nonlinear circuit means connected only to said first and said third balun pair means and connecting said balun pairs in a parallel circuit configuration;
   second nonlinear circuit means connected only to said second and fourth balun pair means and connecting said balun pairs in a parallel circuit configuration; and
   intermediate frequency means, for conducting intermediate frequency type signals, connected to each of said first and second nonlinear circuit means whereby carrier frequency type signals interact with one of said signal frequency type signals and intermediate frequency type signals to translate signals of one type to the other type in the combination of said first and second nonlinear circuit means.

4. Apparatus for isolating signals ($f_s$) and carrier ($f_c$) frequency signals from affecting one another in a frequency translator comprising, in combination:
   first balun means including a primary circuit and first and second secondary circuits wherein each of said secondary circuits use a dot connection designation for relative instantaneous polarity value;
   second balun means including a primary circuit and first and second secondary circuits wherein each of said secondary circuits uses a dot connection designation for relative instantaneous polarity value;
   first means connecting said first secondary circuits of said first and second balun means together and in parallel wherein effective dot connections thereof are together;
   second means connecting said second secondary circuits of said first and second balun means together and in parallel wherein effective dot connections thereof are crossed, the crossing of dot connections causing signal cancellations in primary circuits for signal isolation;

diode means connected to said first and second secondary circuits of said first and second balun means;

intermediate frequency (IF) terminal means connected to said diode means;
$f_s$ terminal means connected to said first balun means; and
$f_c$ terminal means connected to said balun means.

* * * * *